United States Patent
Lin et al.

(10) Patent No.: US 10,961,616 B2
(45) Date of Patent: Mar. 30, 2021

(54) FINE MASK SUPPORT FRAME, FINE MASK, AND METHOD FOR FABRICATING THE SAME

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Zhiming Lin, Beijing (CN); Baojun Li, Beijing (CN); Jian Zhang, Beijing (CN); Pu Sun, Beijing (CN); Chun Chieh Huang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 181 days.

(21) Appl. No.: 16/301,650

(22) PCT Filed: Jan. 5, 2018

(86) PCT No.: PCT/CN2018/071600
§ 371 (c)(1),
(2) Date: Nov. 14, 2018

(87) PCT Pub. No.: WO2018/205664
PCT Pub. Date: Nov. 15, 2018

(65) Prior Publication Data
US 2019/0177831 A1    Jun. 13, 2019

(30) Foreign Application Priority Data
May 12, 2017 (CN) .......................... 201710333242.6

(51) Int. Cl.
*C23C 14/04* (2006.01)
*H01L 51/56* (2006.01)
(Continued)

(52) U.S. Cl.
CPC ............ *C23C 14/042* (2013.01); *C23C 14/24* (2013.01); *H01L 51/00* (2013.01); *H01L 51/56* (2013.01)

(58) Field of Classification Search
CPC .............................. C23C 14/042; C32C 16/04
See application file for complete search history.

(56) References Cited

U.S. PATENT DOCUMENTS

2010/0189559 A1*  7/2010  Sharp ................... C23C 14/042
                                                            415/208.1

FOREIGN PATENT DOCUMENTS

CN          1450196 A       10/2003
CN        103668050 A        3/2014
(Continued)

OTHER PUBLICATIONS

The State Intellectual Property Office of People's Repulic of China, "First Office Action," issued in connection with Application No. 201710333242.6, dated Nov. 6, 2018, 13 pages.
(Continued)

*Primary Examiner* — Joseph A Miller, Jr.
(74) *Attorney, Agent, or Firm* — Arent Fox LLP; Michael Fainberg

(57) ABSTRACT

This disclosure relates to the field of display fabrication technologies, and discloses a fine mask support frame, a fine mask, and a method for fabricating the same. The fine mask support frame includes: a plurality of bezels surrounding a mask area, wherein adjustment openings are arranged on at least one pair of bezels arranged opposite to each other, and at least one adjustment piece is arranged on each of the (Continued)

adjustment openings, wherein the adjustment piece is configured to adjust a shape of a corresponding adjustment opening to thereby adjust deformation of the mask area.

7 Claims, 11 Drawing Sheets

(51) Int. Cl.
*C23C 14/24* (2006.01)
*H01L 51/00* (2006.01)

(56) References Cited

FOREIGN PATENT DOCUMENTS

| CN | 103668051 A | 3/2014 |
|----|-------------|--------|
| CN | 104169455 A | 11/2014 |
| CN | 105607412 A | 5/2016 |
| CN | 105714247 A | 6/2016 |
| CN | 105839052 A | 8/2016 |
| CN | 106367718 A | 2/2017 |
| CN | 107058946 A | 8/2017 |
| KR | 20070063307 A | 6/2007 |

OTHER PUBLICATIONS

International Bureau, "International Search Report," issued in connection with Application No. PCT/CN2018/071600, dated Apr. 12, 2018, 2 pages.

* cited by examiner

FINE MASK SUPPORT FRAME, FINE MASK, AND METHOD FOR FABRICATING THE SAME

This application is a National Stacie of International Application No. PCT/CN2018/071600, filed Jan. 5, 2018, which claims priority of Chinese Patent Application No. 201710333242.6, filed with the Chinese Patent Office on May 12, 2017, both of which are hereby incorporated by reference in their entireties.

FIELD

This disclosure relates to the field of display fabrication technologies, and particularly to a fine mask support frame, a fine mask, and a method for fabricating the same.

BACKGROUND

An organic light-emitting layer in the existing Organic Light-Emitting Diode (OLED) is fabricated through vacuum vapor-plating. The OLED element is fabricated by depositing an organic material on a substrate located above a vapor source through vapor-plating at high temperature, and in order to vapor-plate the organic material onto a specific position as designed, a high-precision mask, i.e., a fine mask, shall be used below the substrate, where pre-designed valid opening areas are arranged on the fine mask, and the organic material is deposited onto a backboard through the valid opening areas to form a preset pattern. The precision of plating may be affected directly by the changing sizes and positions of the valid opening areas on the fine mask.

SUMMARY

An embodiment of this disclosure provides a fine mask support frame including: a plurality of bezels surrounding a mask area, wherein adjustment openings are arranged on at least one pair of bezels arranged opposite to each other, and at least one adjustment piece is arranged on each of the adjustment openings, wherein the adjustment piece is configured to adjust a shape of a corresponding adjustment opening to thereby adjust deformation of the mask area.

In some embodiment of this disclosure, each adjustment piece includes a screw and a locking nut, two ends of the screw are connected respectively with a first sidewall and a second sidewall of an adjustment opening, and the locking nut is arranged in the adjustment opening, and sleeved on the screw, wherein a thread hole is arranged on the first sidewall and a hole is arranged on the second sidewall, and a length direction of the first sidewall, and a length direction of the second sidewall are same as a length direction of the adjustment opening.

In some embodiment of this disclosure, each adjustment piece includes a screw and two locking nuts, wherein two ends of the screw are connected respectively with a first sidewall and a second sidewall of an adjustment opening, and the two locking nuts are arranged in the adjustment opening, and sleeved on the screw, wherein a hole is respectively arranged on the first sidewall and the second sidewall, and a length direction of the first sidewall, and a length direction of the second sidewall are same as a length direction of the adjustment opening.

In some embodiment of this disclosure, each adjustment piece includes a bolt abutting against a second sidewall of an adjustment opening through a first sidewall of the adjustment opening, wherein a thread hole configured to be engaged with the bolt is arranged on the first sidewall, a length direction of the first sidewall, a length direction of the second sidewall are same as a length direction of the adjustment opening, and the first sidewall is farther from the mask area than the second sidewall.

In some embodiment of this disclosure, each adjustment piece includes a bolt inserted into and connected with a second sidewall of an adjustment opening through a first sidewall of the adjustment opening, wherein a thread hole configured to be engaged with the bolt is arranged on the first sidewall, a blind hole is arranged on the second sidewall, a length direction of the first sidewall, a length direction of the second sidewall are same as a length direction of the adjustment opening, and the first sidewall is farther from the mask area than the second sidewall.

In some embodiment of this disclosure, each adjustment piece include a bolt screwed into and connected with a second sidewall of an adjustment opening through a first sidewall of the adjustment opening, wherein a through-hole configured to be engaged with the bolt is arranged on the first sidewall, a thread hole is arranged on the second sidewall, a length direction of the first sidewall, a length direction of the second sidewall are same as a length direction of the adjustment opening, and the first sidewall is farther from the mask area than the second sidewall.

In some embodiment of this disclosure, a length of each of the adjustment openings is greater than or equal to one second of a length of a bezel including the each of the adjustment openings, and less than or equal to seven ninths of the length of the bezel including the each of the adjustment openings.

An embodiment of this disclosure further provides a fine mask including: the fine mask support frame according to any one of the embodiments above of this disclosure, and mask strips overlying the mask area of the fine mask support frame, wherein the mask strips are fixed relative to the fine mask support frame.

In some embodiment of this disclosure, a length direction of the adjustment openings is perpendicular to a length direction of the mask strips, thus resulting in a better effect of adjustment, and making it convenient to adjust a pulling force.

In some embodiment of this disclosure, a quantity of the adjustment pieces arranged on each of the adjustment openings is same as a quantity of the mask strips.

An embodiment of this disclosure further provides a method for fabricating a fine mask, the method including:
providing the fine mask support frame according to any one of the embodiments above of this disclosure;
applying an acting force to the fine mask support frame;
fixing mask strips, to which a first pulling force is applied, on the fine mask support frame; and
adjusting the adjustment pieces to adjust a shape of corresponding adjustment openings so that the fixed mask strips are subjected to the same pulling force as they were not fixed.

In some embodiment of this disclosure, between the providing the fine mask support frame according to any one of the embodiments above of this disclosure, and the applying the acting force to the fine mask support frame, the method further includes:
applying an extruding force to sidewalls of the adjustment openings, which are proximate to the mask area through the adjustment pieces.

DETAILED DESCRIPTION OF THE EMBODIMENTS

The technical solutions according to the embodiments of this disclosure will be described below clearly and fully with reference to the drawings in the embodiments of this disclosure, and apparently the embodiments to be described are only a part but not all of the embodiments of this disclosure. Based upon the embodiments here of this disclosure, all the other embodiments which can occur to those ordinarily skilled in the art without any inventive effort shall fall into the claimed scope of this disclosure.

The existing fine mask is fabricated by soldering mask strips on a mask frame, but the mask strips shall be soldered by applying an external force so that the sizes and positions of openings on the mask strips are precise as appropriate, and accordingly an extruding force shall be applied to the mask frame so that the soldered mask strips can still be subjected to the same pulling force as they were not soldered (the pulling force is a force acted by the metal frame, which has been resumed from deformation, on the mask strips soldered thereon) so that the valid opening areas of the soldered mask strips remain the same as they were not soldered. However the fluctuating extruding force, applied to the metal frame, as preset in real production is generally either too strong or too weak so that there are different positional precisions of the valid opening areas of the soldered mask strips in comparison with as they were not soldered, where the valid opening areas of the soldered mask strips may shrink inward (if the extruding force is preset too weak) or expand outward (if the extruding force is preset too strong). As the fine mask has been used for a longer period of time, the soldered mask strips become more relaxed, and the valid opening areas of the fine mask become more deformed, thus degrading the precision of the layer formed using the fine mask.

Figure 1:
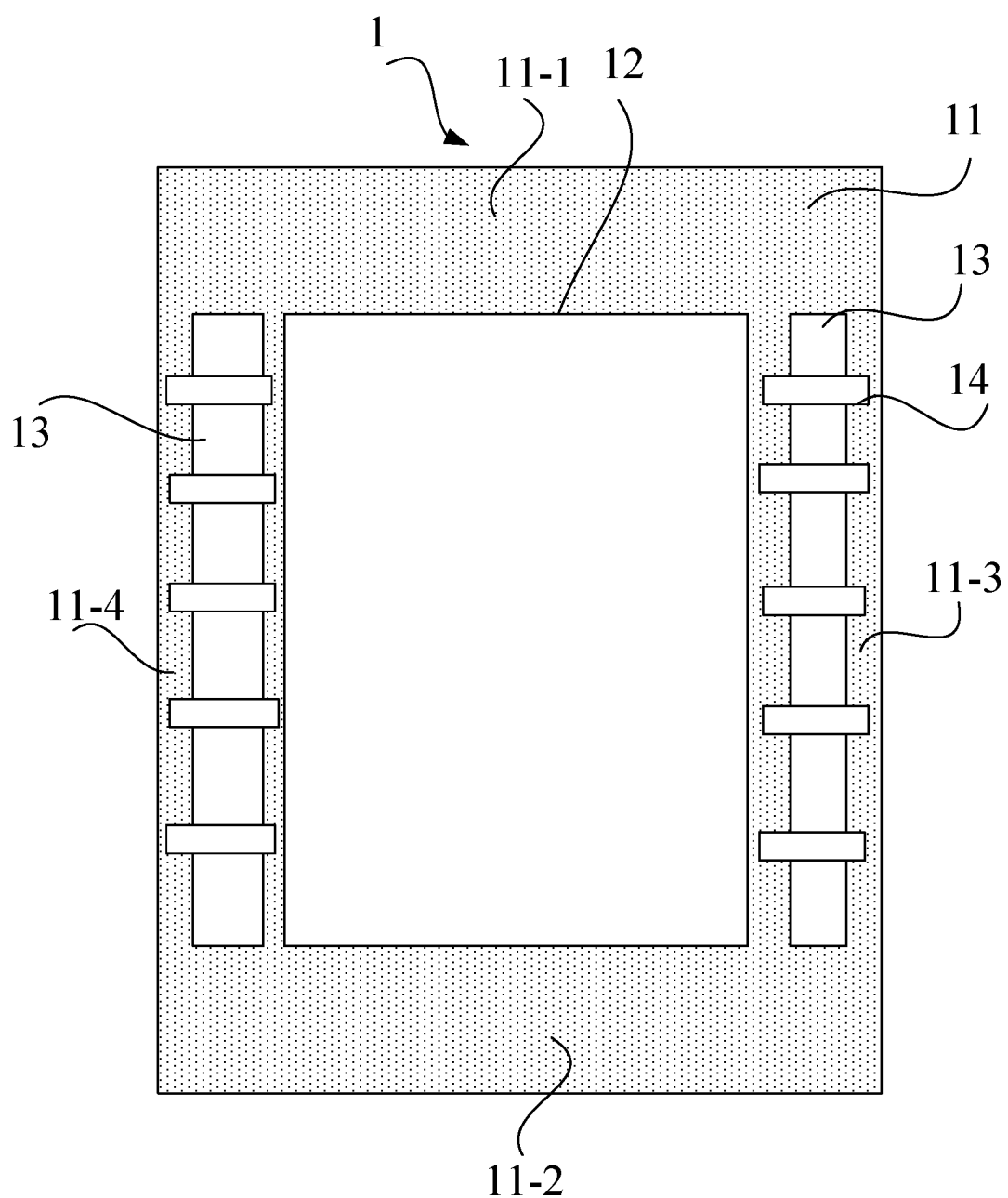
FIG. 1 is a schematic diagram of a first structure of a fine mask support frame according to an embodiment of this disclosure.

As illustrated in FIG. 1, a fine mask support frame 1 according to an embodiment of this disclosure includes a plurality of bezels 11-1, 11-2, 11-3, and 11-4 (collectively referred to as 11) surrounding a mask area 12, where adjustment openings 13 are arranged on at least one pair of bezels 11-3 and 11-4 arranged opposite to each other, and at least one adjustment piece 14 is arranged on each adjustment opening 13, where the adjustment piece 14 is configured to adjust the shape of the corresponding adjustment opening 13 to thereby adjust deformation of the mask area 12.

In the fine mask support frame 1 according to the embodiment of this disclosure, the adjustment openings 13 and the adjustment pieces 14 can be arranged to change the deformation of the adjustment openings 13 to thereby adjust deformation of the mask area 12. Mask strips are subjected to a pulling force before they are arranged on the fine mask support frame 1, and in order to enable the mask strips fixed on the fine mask support frame 1 to be still subjected to the same pulling force as they were not fixed, an extruding force is applied in advance to the fine mask support frame 1 so that the fixed mask strips are subjected to the same pulling force as they were not fixed. While the mask strips are being soldered, as an extruding force applied to a fine mask is decrementing, the fine mask support frame 1 is being resumed from deformation, and at this time, the fine mask support frame 1 applies a pulling force to the mask strips soldered thereon: and when the pulling force applied by the fine mask support frame 1 to the mask strips is not equal to the pulling force applied to the mask strips before they are fixed, the shapes of the adjustment openings 13 can be changed to thereby adjust deformation of the mask area 12 so as to adjust the pulling force applied to the mask strips fixed on the fine mask support frame 1, so that the fixed mask strips are subjected to the same pulling force as they were not fixed, and thus there will be the same positional precision of openings of the soldered mask strips as they were not soldered to thereby improve the positional precision of opening areas of the mask so as to improve the precision of the mask.

The adjustment pieces above can be structured particularly in the following implementations.

Figure 2A:
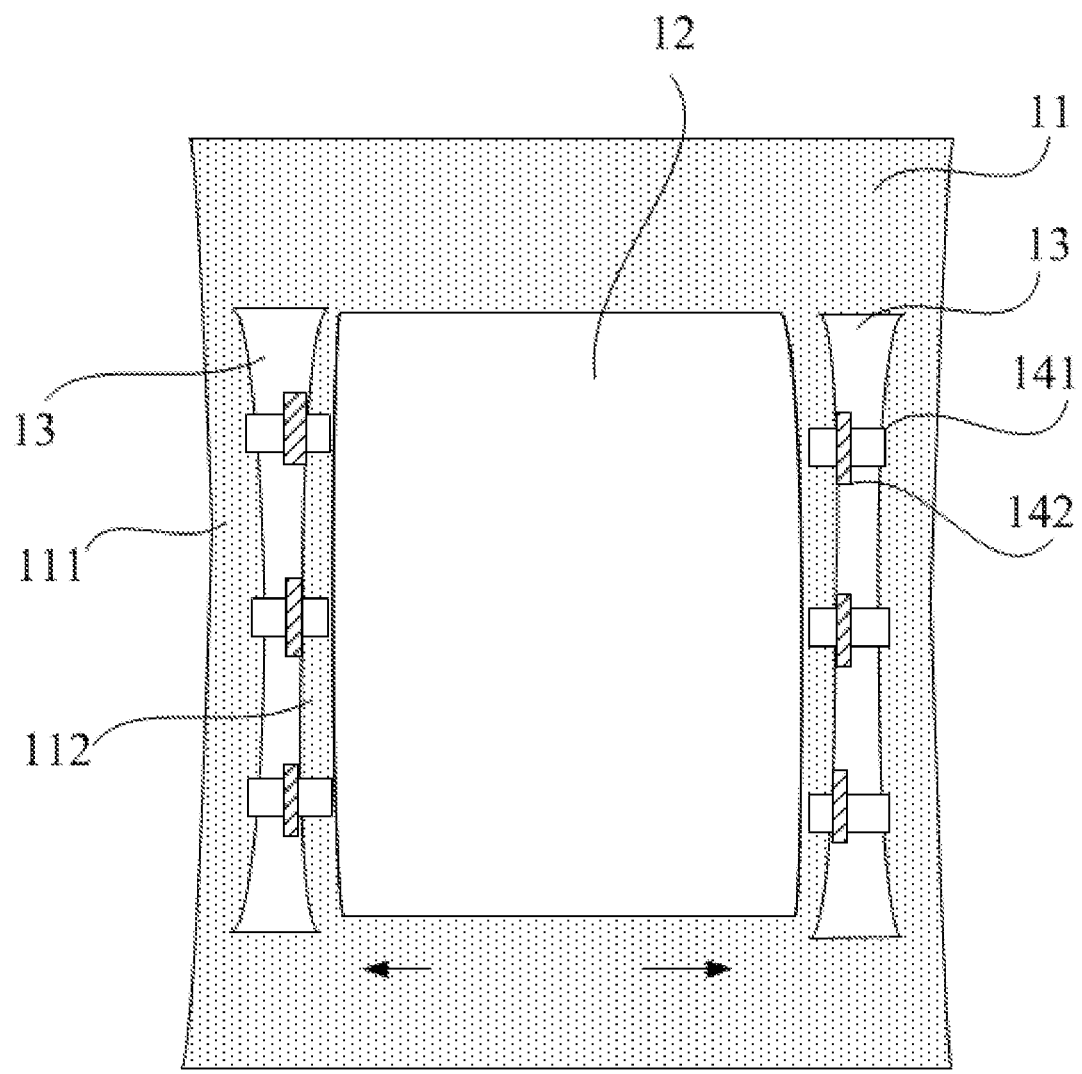
FIG. 2A is a schematic state diagram of a second structure of the fine mask support frame according to the embodiment of this disclosure.
Figure 2B:
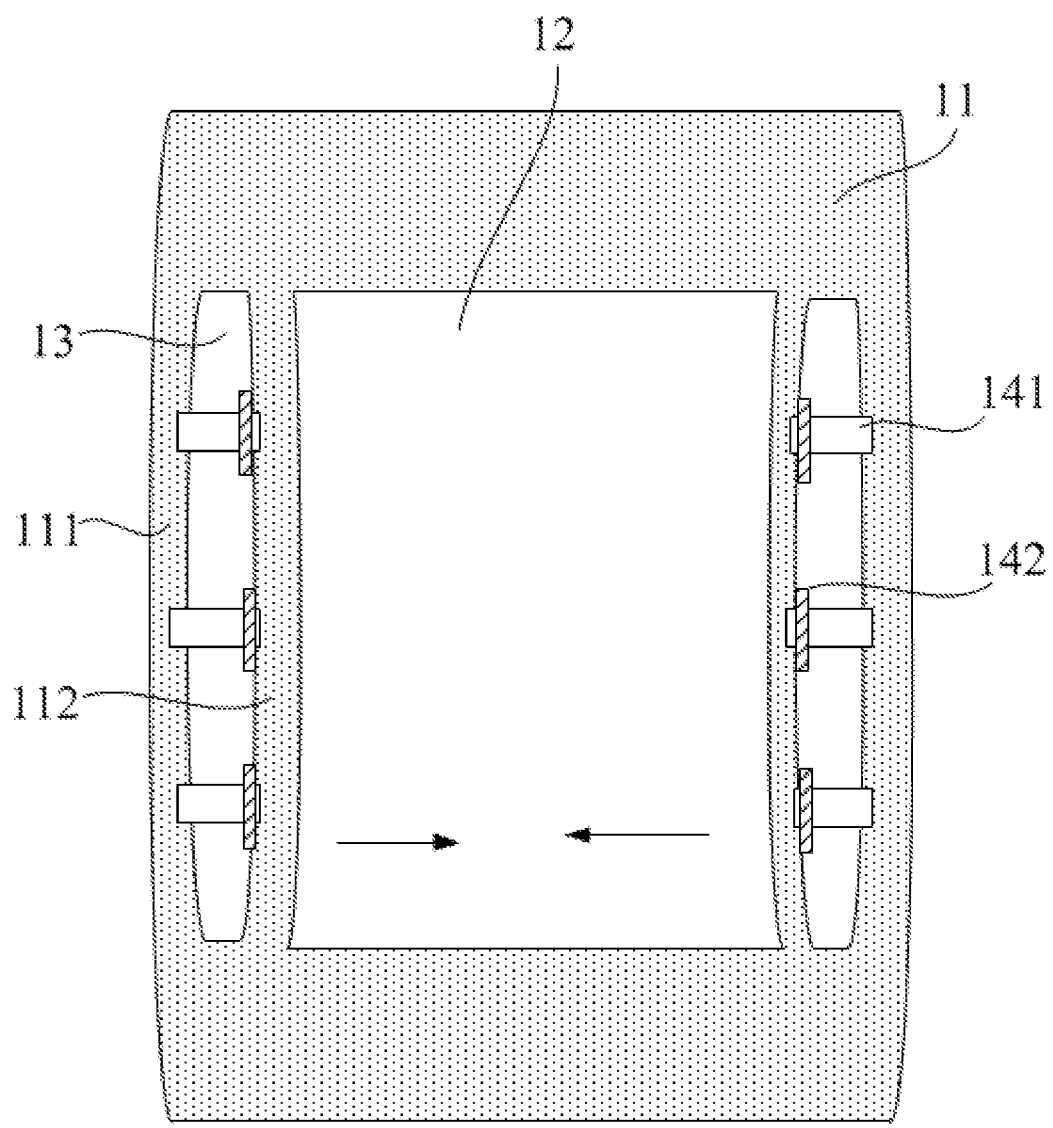
FIG. 2B is another schematic state diagram of a second structure of the fine mask support frame according to the embodiment of this disclosure.

In an optional implementation, as illustrated in FIG. 2A and FIG. 2B, each adjustment piece includes a screw 141 and a locking nut 142, where two ends of the screw 141 are connected respectively with a first sidewall 111 and a second sidewall 112 of an adjustment opening 13, and the locking nut 142 is arranged in the adjustment opening 13, and sleeved on the nut 141, where a thread hole is arranged on the first sidewall 111, and a hole is arranged on the second sidewall 112, or a thread hole is arranged on the second sidewall 112, and a hole is arranged on the first sidewall 111; and both the length direction of the first sidewall 111, and the length direction of the second sidewall 112 are the same as the length direction of the adjustment opening 13. Particularly the locking nut 142 can enable such one of the first sidewall 111 and the second sidewall 112 that is proximate to the mask area 12 (e.g., the second sidewall 112 as illustrated) to be concaved inward, or to expand outward to thereby vary a pulling force applied to the overlying mask strips, thus making it convenient to adjust the pulling force.

Figure 3A:
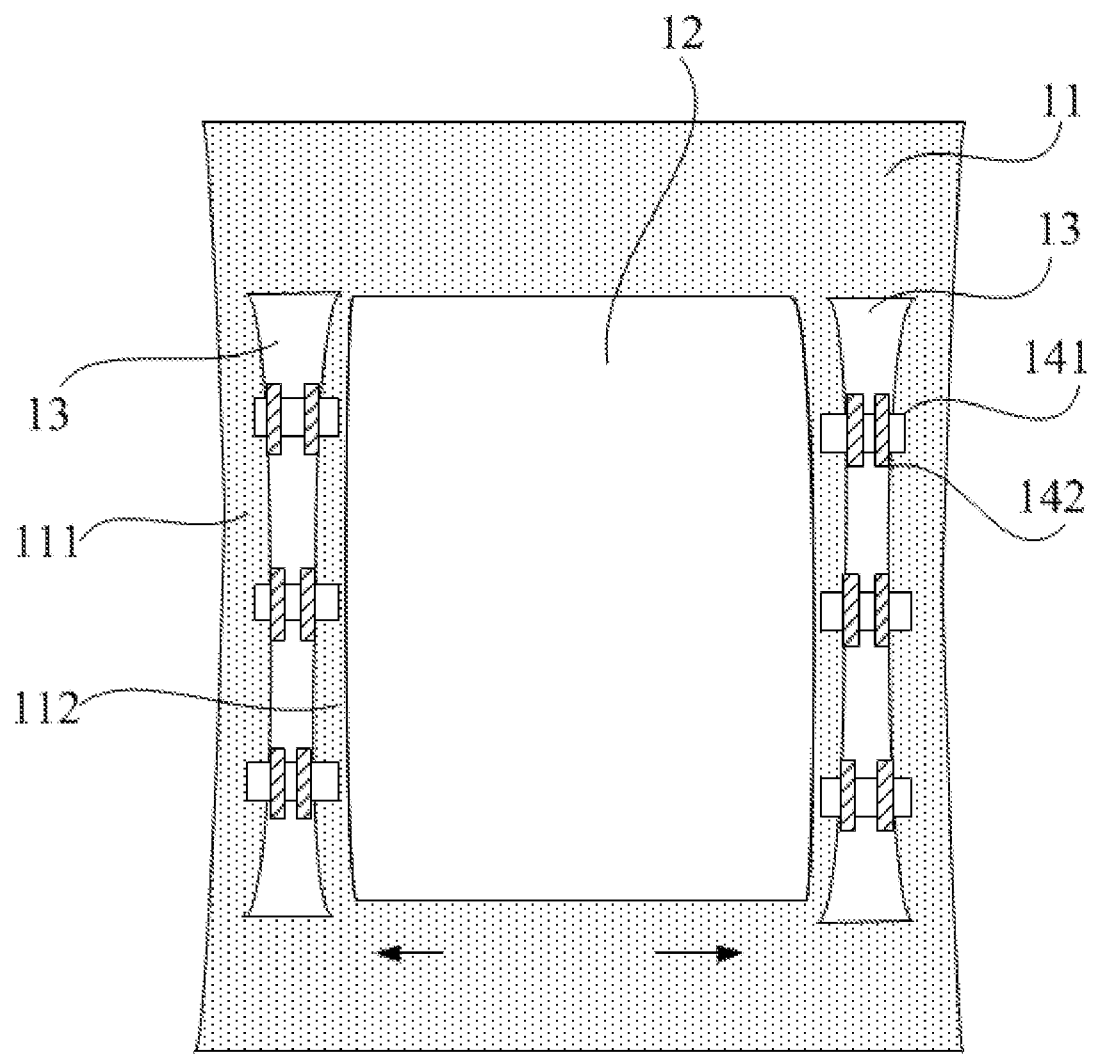
FIG. 3A is a schematic state diagram of a third structure of the fine mask support frame according to the embodiment of this disclosure.
Figure 3B:
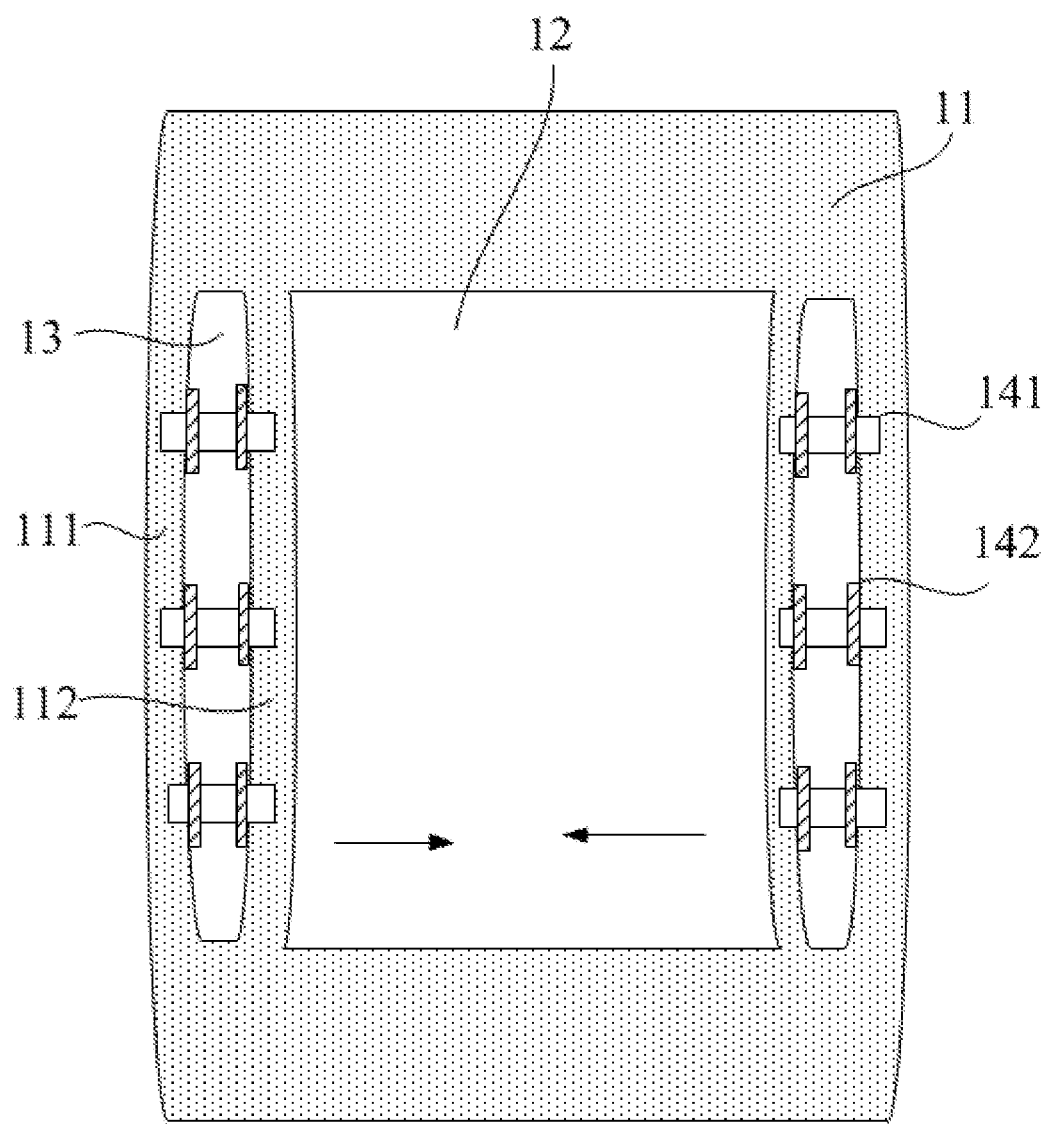
FIG. 3B is another schematic state diagram of a third structure of the fine mask support frame according to the embodiment of this disclosure.

In another optional implementation, as illustrated in FIG. 3A and FIG. 3B, each adjustment piece includes a screw 141 and two locking nuts 142, where two ends of the screw 141 are connected respectively with a first sidewall 111 and a second sidewall 112 of an adjustment opening 13, and the two locking nuts 142 are arranged in the adjustment opening 13, and sleeved on the nut 141, where holes are arranged on both the first sidewall 111 and the second sidewall 112, and both the length direction of the first sidewall 111, and the length direction of the second sidewall 112 are the same as the length direction of the adjustment opening 13. When the fixed mask strips shrink, that is, the pulling force applied to the mask strips before they are fixed is stronger than the pulling force applied by the fine mask support frame resumed from deformation to the mask strips, as illustrated in FIG. 3A, the two locking nuts 142 can be adjusted to reduce the width of the adjustment opening 13 so that two sides of the mask area 12, which are adjacent to the adjustment opening 13 (i.e., the left and right sides in the orientation as illustrated) expand outward, and upper and lower sides thereof shrink inward; and at this time, the fine mask support frame applies an outward-pulling force to the mask strips fixed thereon (in the direction as denoted by the arrows in FIG. 3A) so that the fixed mask strips are subjected to the same pulling force as they were not fixed. On the contrary, when the fixed mask strips are tensioned, that is, the pulling force applied to the mask strips before they are fixed is weaker than the pulling force applied by the fine mask support frame resumed from deformation to the mask strips, as illustrated in FIG. 3B, the two locking nuts 142 can be adjusted to increase the width of the adjustment opening 13 so that two sides of the mask area 12, which are adjacent to the adjustment opening 13 (i.e., the left and right sides in the orientation as illustrated) shrink inward, and upper and lower sides thereof expand outward; and at this time, the fine mask support frame applies an inward-relaxing force to the mask strips fixed thereon (in the direction as denoted by the arrows in FIG. 3B) so that the left and right sides of the mask strips shrink, and the mask strips are relaxed, so the fixed mask strips are subjected to the same pulling force as they were not fixed. With the adjustment above, the positional precision of the opening areas of the mask, and thus the precision of the mask can be improved.

Figure 4A:
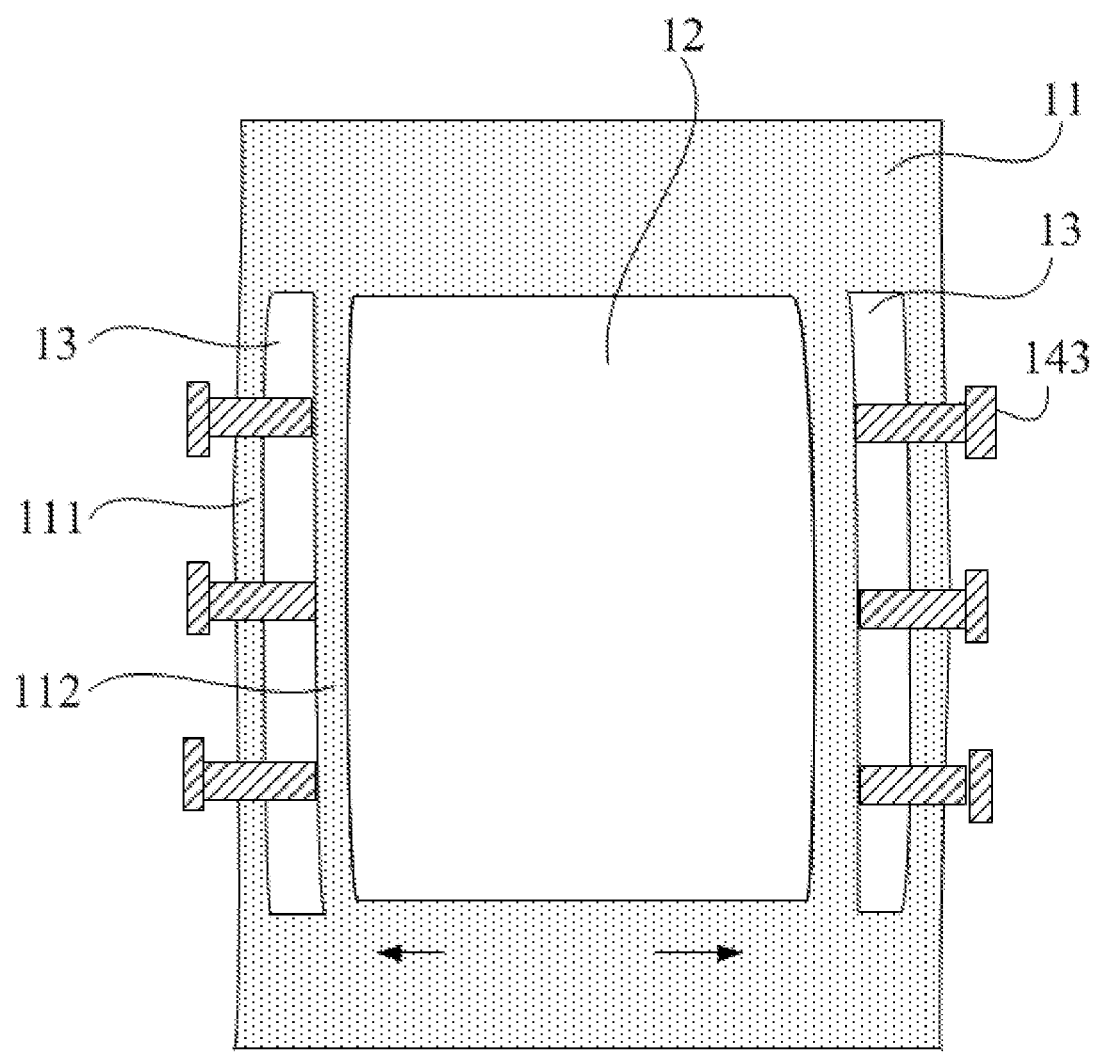
FIG. 4A is a schematic state diagram of a fourth structure of the fine mask support frame according to the embodiment of this disclosure.
Figure 4B:
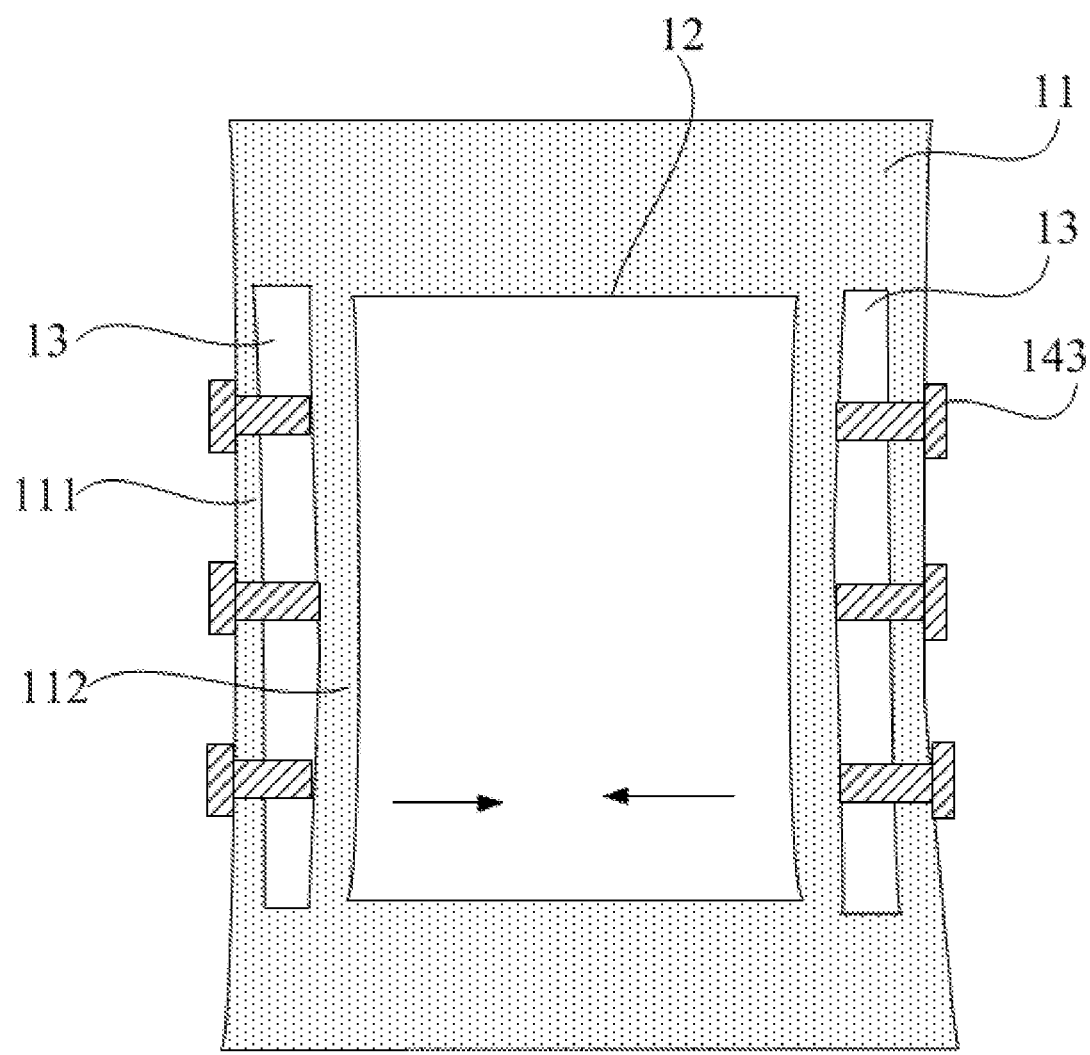
FIG. 4B is another schematic state diagram of a fourth structure of the fine mask support frame according to the embodiment of this disclosure.

In a further optional implementation, as illustrated in FIG. 4A and FIG. 4B, each adjustment piece includes a bolt 143 abutting against a second sidewall 112 of an adjustment opening 13 through a first sidewall 111 of the adjustment opening 13, where a thread hole to be engaged with the bolt 143 is arranged on the first sidewall 111, both the length direction of the first sidewall 111, the length direction of the second sidewall 112 are the same as the length direction of the adjustment opening 13, and the first sidewall 111 is farther from the mask area 12 than the second sidewall 112. When the fixed mask strips shrink, that is, the pulling force applied to the mask strips before they are fixed is stronger than the pulling force applied by the fine mask support frame resumed from deformation to the mask strips, as illustrated in FIG. 4A, the bolt 143 can be unscrewed to reduce an acting force of the bolt 143 on the second sidewall 112 against which it abuts so that the second sidewall 112 expands outward, so two sides of the mask area 12, which are adjacent to the adjustment opening 13 (i.e., the left and right sides in the orientation as illustrated) expand outward, and upper and lower sides thereof shrink inward; and at this time, the fine mask support frame applies an outward-pulling force to the mask strips fixed thereon (in the direction as denoted by the arrows in FIG. 4A) so that the fixed mask strips are subjected to the same pulling force as they were not fixed. On the contrary, when the fixed mask strips are tensioned, that is, the pulling force applied to the mask strips before they are fixed is weaker than the pulling force applied by the fine mask support frame resumed from deformation to the mask strips, as illustrated in FIG. 4B, the bolt 143 can be screwed to increase an acting force of the bolt 143 on the second sidewall 112 so that the second sidewall 112 shrinks inward, so two sides of the mask area 12, which are adjacent to the adjustment opening 13 (i.e., the left and right sides in the orientation as illustrated) shrink inward, and upper and lower sides thereof expand outward; and at this time, the fine mask support frame applies an inward-relaxing force to the mask strips fixed thereon (in the direction as denoted by the arrows in FIG. 4B) so that the left and right sides of the mask strips shrink, and the mask strips are relaxed, so the fixed mask strips are subjected to the same pulling force as they were not fixed. With the adjustment above, the positional precision of the opening areas of the mask, and thus the precision of the mask can be improved.

Figure 5A:
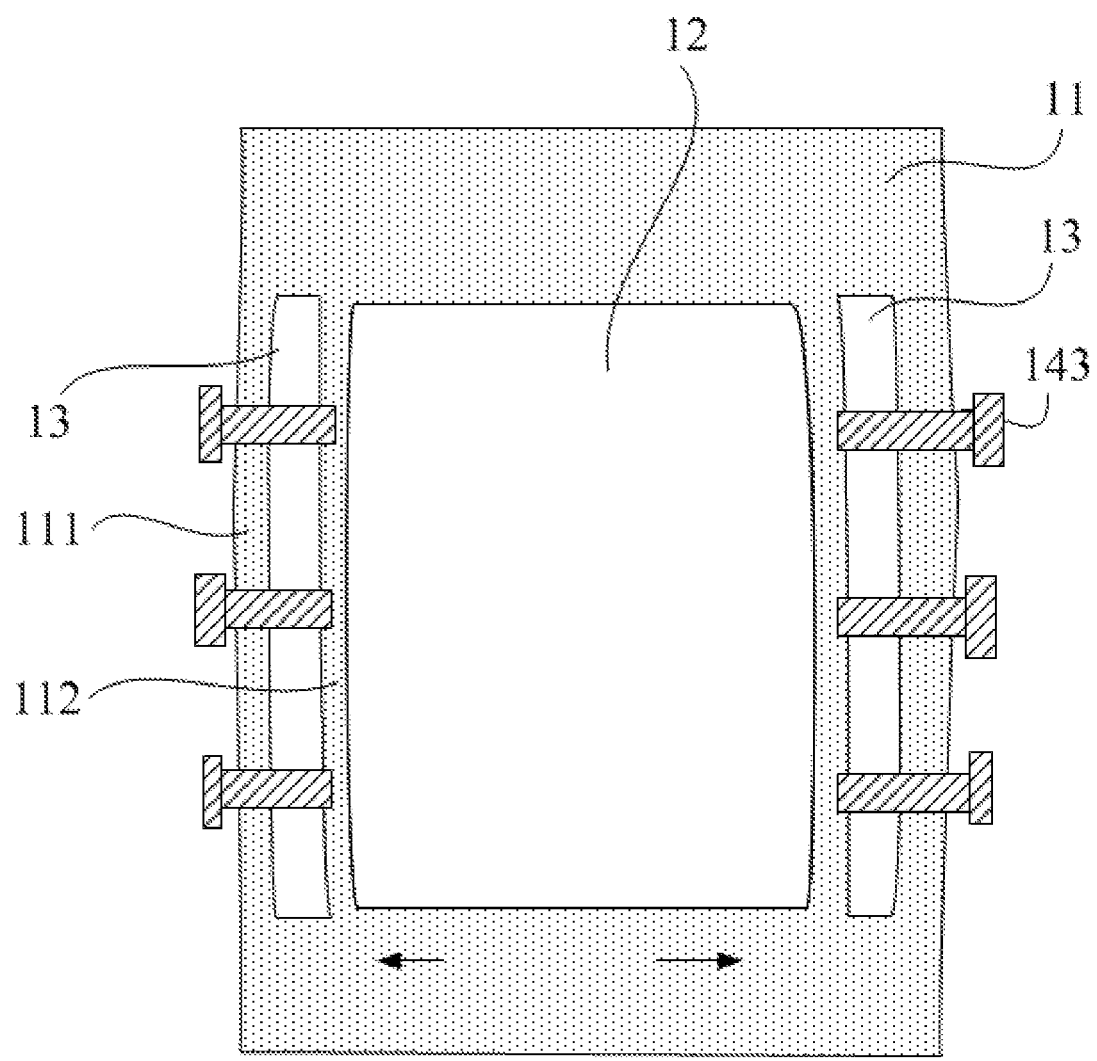
FIG. 5A is a schematic state diagram of a fifth structure of the fine mask support frame according to the embodiment of this disclosure.
Figure 5B:
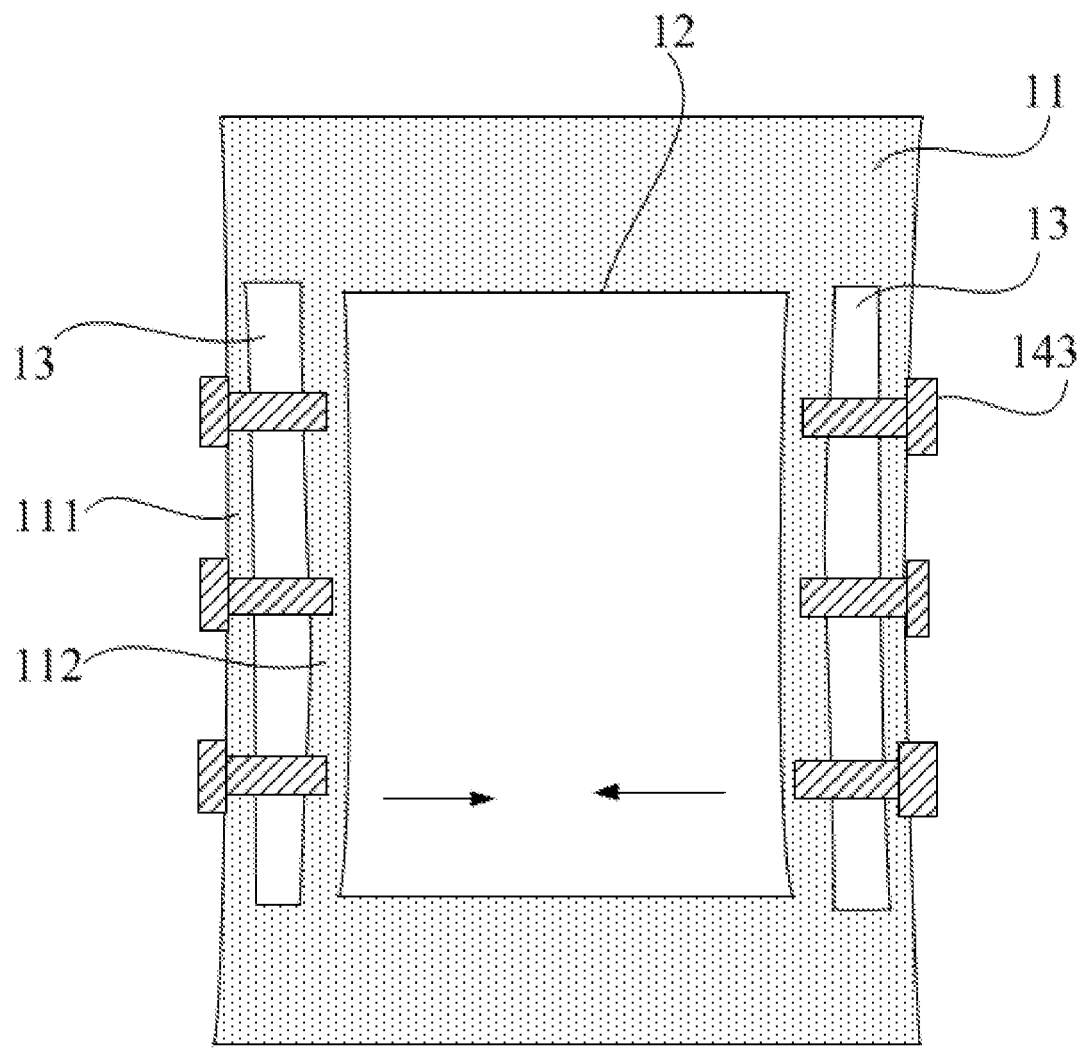
FIG. 5B is another schematic state diagram of a fifth structure of the fine mask support frame according to the embodiment of this disclosure.

In a further optional implementation, each adjustment piece includes a bolt 143 inserted into and connected with a second sidewall 112 of an adjustment opening 13 through a first sidewall 111 of the adjustment opening 13, where a thread hole to be engaged with the bolt 143 is arranged on the first sidewall 111, a blind hole is arranged on the second sidewall 112, both the length direction of the first sidewall 111, the length direction of the second sidewall 112 are the same as the length direction of the adjustment opening 13, and the first sidewall 111 is farther from the mask area 12 than the second sidewall 112. When the fixed mask strips shrink, that is, the pulling force applied to the mask strips before they are fixed is stronger than the pulling force applied by the fine mask support frame resumed from deformation to the mask strips, as illustrated in FIG. 5A, the bolt 143 can be unscrewed to apply an outward-pulling force to the second sidewall 112 so that the second sidewall 112 expands outward, so two sides of the mask area 12, which are adjacent to the adjustment opening 13 (i.e., the left and right sides in the orientation as illustrated) expand outward, and upper and lower sides thereof shrink inward; and at this time, the fine mask support frame applies an outward-pulling force to the mask strips fixed thereon (in the direction as denoted by the arrows in FIG. 5A) so that the fixed mask strips are subjected to the same pulling force as they were not fixed. On the contrary, when the fixed mask strips are tensioned, that is, the pulling force applied to the mask strips before they are fixed is weaker than the pulling force applied by the fine mask support frame resumed from deformation to the mask strips, as illustrated in FIG. 5B, the bolt 143 can be screwed to extrude the second sidewall 112 so that the second sidewall 112 shrinks inward, so two sides of the mask area 12, which are adjacent to the adjustment opening 13 (i.e., the left and right sides in the orientation as illustrated) shrink inward, and upper and lower sides thereof expand outward; and at this time, the fine mask support frame applies an inward-relaxing force to the mask strips fixed thereon (in the direction as denoted by the arrows in FIG. 5B) so that the mask strips shrink, so the fixed mask strips are subjected to the same pulling force as they were not fixed. With the adjustment above, the positional precision of the opening areas of the mask, and thus the precision of the mask can be improved.

In a still further optional implementation, each adjustment piece include a bolt 143 screwed into and connected with a second sidewall 112 of an adjustment opening 13 through a first sidewall 111 of the adjustment opening 13, where a through-hole to be engaged with the bolt 143 is arranged on the first sidewall 111, a thread hole is arranged on the second sidewall 112, both the length direction of the first sidewall 111, the length direction of the second sidewall 112 are the same as the length direction of the adjustment opening 13, and the first sidewall 111 is farther from the mask area 12 than the second sidewall 112. A particular adjustment process can be as described in the immediately preceding implementation, and the bolt 143 can be unscrewed or screwed so that the first sidewall 111 and the second sidewall 112 are concaved inward or expand outward, thus making it convenient to adjust the pulling force.

In any one of the implementations above, the adjustment piece can alternatively adjust as such to deform only such one of the first sidewall 111 and the second sidewall 112 that is proximate to the mask area 12, and not to deform the other sidewall away from the mask area 12.

In order to enable the adjustment opening 13 to perform a better adjustment function, some acting force can be applied in advance to the adjustment piece so that the acting farce can be increased or reduced for a better adjustment effect.

In order to make the mask area 12 more deformed in the adjustment process, the length direction of two adjustment openings 13 is perpendicular to the length direction of the mask strips fixed on the fine mask support frame.

In order to facilitate adjustment, the number of adjustment pieces arranged on each adjustment opening 13 is the same as the number of mask strips.

Optionally, the length of each adjustment opening 13 is greater than or equal to one second of the length of a bezel 11 (e.g., the bezel 11-3 or the bezel 11-4 in FIG. 1) including the adjustment opening 13, and less than or equal to seven ninths of the length of the bezel 11 (e.g., the bezel 11-3 or the bezel 11-4 in FIG. 1) including the adjustment opening 13 so that the convenience of adjusting using the fine mask support frame can be improved while guaranteeing the support capacity of the fine mask support frame.

It shall be noted that the widths of two adjustment openings 13 in their arrangement direction can be set as needed, and in order to guarantee the support capacity of the fine mask support frame, this width is preferably set small, and if the adjustment openings include the nuts 142, then it will suffice if the width of an adjustment opening 13 is set to the sum of a width for accommodating a nut 142, and allows some gap for adjusting the nut 142.

Figure 6:
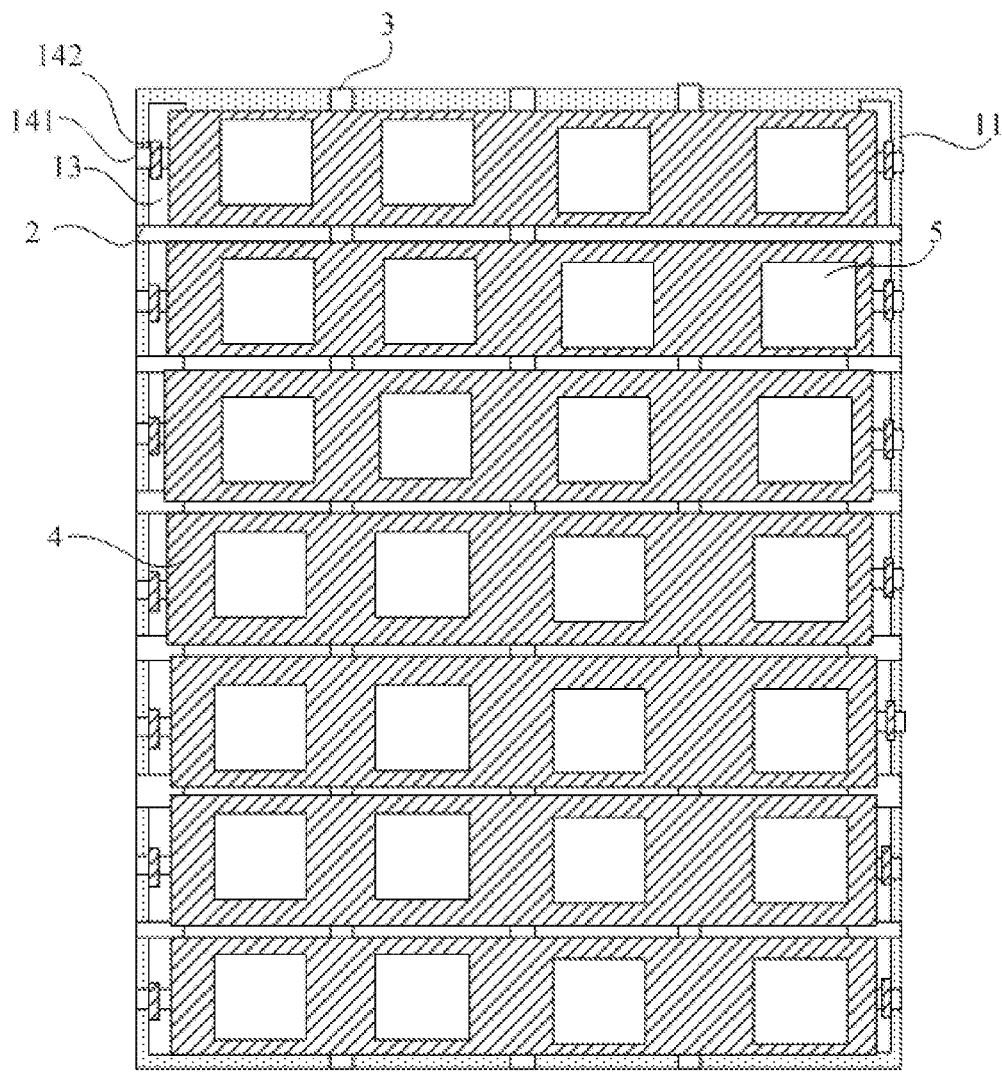
FIG. 6 is a schematic structural diagram of a fine mask according to an embodiment of this disclosure.

As illustrated in FIG. 6, an embodiment of this disclosure further provides a fine mask including the fine mask support frame according to any one of the embodiments above of this disclosure, and mask strips 4 overlying the mask area 12 of the fine mask support frame, where the mask strips 4 are fixed relative to the fine mask support frame. Since the fine mask support frame above can improve the positional precision of the opening areas of the mask, the fine mask according to the embodiment of this disclosure can have high mask precision.

The fine mask above typically further includes shielding strips 2 soldered horizontally on the fine mask support frame, and support strips 3 soldered vertically on the fine mask support frame, where the shielding strips 2 are configured to shield gaps between the respective mask strips 4, and the support strips 3 are configured to support the mask strips 4. A plurality of openings 5 are arranged on the mask strips 4. Both the shielding strips 2 and the support strips 3 are soldered before the mask strips 4 are soldered, and they can be soldered without applying any extruding force to the fine mask support frame, but the mask strips 4 shall be soldered by applying an external force so that the openings 5 on the mask strips 4 are precise as appropriate, and accordingly an extruding force shall be applied to the fine mask support frame so that the soldered mask strips 4 can still be subjected to the same pulling force as they were not soldered (the pulling force is a force acted by the fine mask support frame, which has been resumed from deformation, on the mask strips 4 soldered thereon) so that the valid opening areas of the soldered mask strips 4 remain the same as they were not soldered.

In order to make the mask area 12 more deformed in an adjustment process, the length direction of two adjustment openings 13 is perpendicular to the length direction of the mask strips 4.

In order to facilitate adjustment, the number of adjustment pieces arranged on each adjustment opening 13 is the same as the number of mask strips 4.

Figure 7:
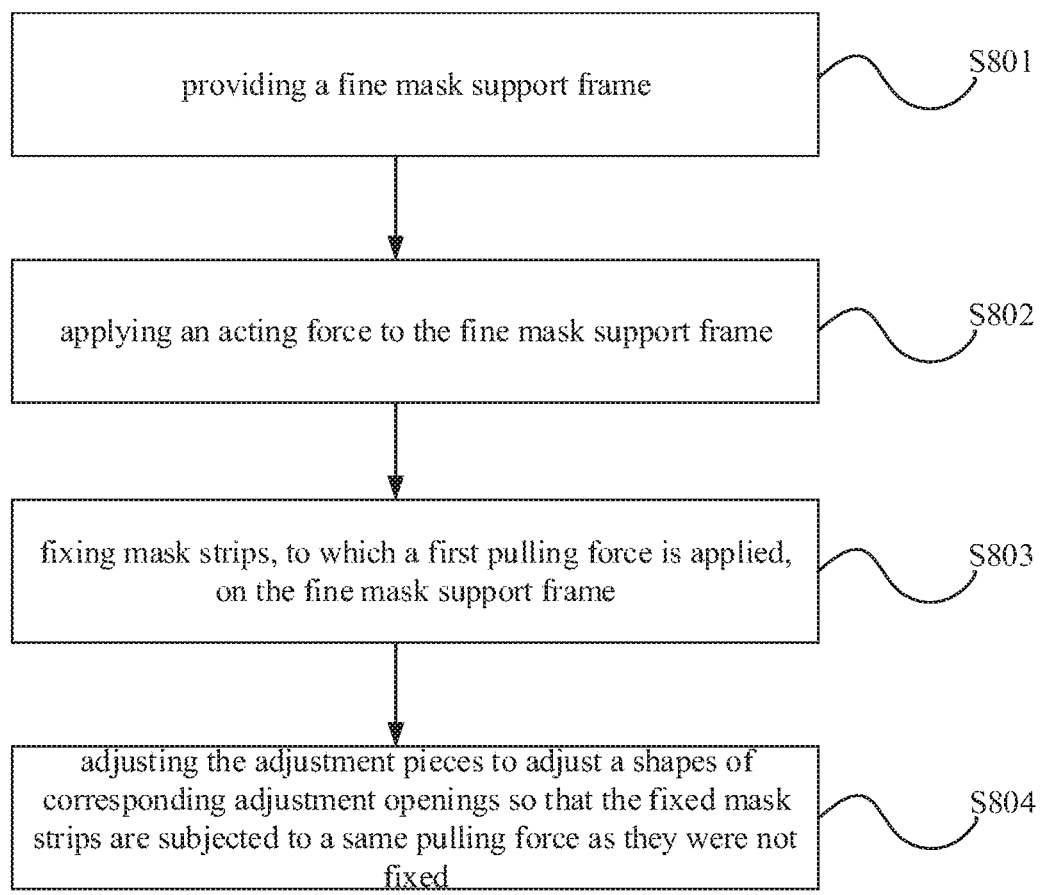
FIG. 7 is a flow chart of fabricating the fine mask according to an embodiment of this disclosure.

As illustrated in FIG. 7, an embodiment of this disclosure further provides a method for fabricating a fine mask, where the method includes the following steps.

The step S801 is to provide a fine mask support frame which is the fine mask support frame according to any one of the embodiments above of this disclosure.

The step S802 is to apply an acting force to the fine mask support frame.

The step S803 is to fix mask strips, to which a first pulling force is applied, on the fine mask support frame.

The step S804 is to adjust the adjustment pieces to adjust the shapes of the corresponding adjustment openings so that the fixed mask strips are subjected to the same pulling force as they were not fixed.

The acting force above can be an extruding force or a pulling force; and when the acting force is an extruding force, an external force applying device acts the force on to sidewalls of the adjustment openings, which are away from the mask area, and when the acting force is an extruding force, the external force applying device acts the force on to sidewalls of the adjustment openings, which are proximate to the mask area.

The adjustment pieces can be adjusted to adjust the adjustment openings after all the mask strips are fixed, or can be adjusted once when each mask strip is fixed.

Furthermore between the step S801 to provide the fine mask support frame according to any one of the embodiments above of this disclosure, and the step S802 to apply the acting force to the fine mask support frame, the method further includes:

applying an extruding force to sidewalls of the adjustment openings, which are proximate to the mask area through the adjustment pieces. The extruding force can be applied in advance to deform the fine mask support frame in advance so that when the pulling force subjected to the mask strips is to be reduced or increased, the deformation of the fine mask support frame can be adjusted to thereby improve the convenience of adjustment.

Evidently those skilled in the art can make various modifications and variations to the disclosure without departing from the spirit and scope of this disclosure. Thus the disclosure is also intended to encompass these modifications and variations thereto so long as the modifications and variations come into the scope of the claims appended to the disclosure and their equivalents.

The invention claimed is:

1. A fine mask support frame, comprising: a plurality of bezels surrounding a mask area, wherein adjustment openings are arranged on at least one pair of bezels arranged opposite to each other, and at least one adjustment piece is arranged on each of the adjustment openings, wherein the adjustment piece is configured to adjust a shape of corresponding adjustment opening to thereby adjust deformation of the mask area;

wherein the adjustment piece comprises a screw and two locking nuts, wherein two ends of the screw are connected respectively with a first sidewall and a second sidewall of an adjustment opening, and the two locking nuts are arranged in the adjustment opening, and sleeved on the screw, wherein a hole is respectively arranged on the first sidewall and the second sidewall, and a length direction of the first sidewall, and a length direction of the second sidewall are same as a length direction of the adjustment opening.

2. The fine mask support frame according to claim 1, wherein a length of each of the adjustment openings is greater than or equal to one second of a length of a bezel comprising the each of the adjustment openings, and less than or equal to seven ninths of the length of the bezel comprising the each of the adjustment openings.

3. A fine mask, comprising: the fine mask support frame according to claim 1, and mask strips overlying the mask area of the fine mask support frame, wherein the mask strips are fixed relative to the fine mask support frame.

4. The fine mask according to claim 3, wherein a length direction of the adjustment openings is perpendicular to a length direction of the mask strips.

5. The fine mask according to claim 3, wherein a quantity of adjustment pieces arranged on each of the adjustment openings are same as a quantity of the mask strips.

6. A method for fabricating a fine mask, the method comprising:

providing the fine mask support frame according to claim 1;

applying an acting force to the fine mask support frame;

fixing mask strips, to which a first pulling force is applied, on the fine mask support frame; and adjusting adjustment pieces to adjust a shape of the corresponding adjustment openings so that the fixed mask strips are subjected to a same pulling force as they were not fixed.

7. The method for fabricating a fine mask according to claim 6, wherein between the providing the fine mask support frame according to claim 1, and the applying the acting force to the fine mask support frame, the method further comprises:

applying an extruding force to sidewalls of the adjustment openings, which are proximate to the mask area through the adjustment pieces.

\* \* \* \* \*